INVENTOR.
ANATOLE TURECKI
BY
Samuel Cohen
Attorney

PULSE GENERATOR EMPLOYING SERIALLY CONNECTED DELAY LINES

Filed Oct. 18, 1963 3 Sheets-Sheet 2

INVENTOR.
ANATOLE TURECKI
BY
Samuel Cohen
Attorney

INVENTOR.
ANATOLE TURECKI
BY Samuel Cohen
Attorney

United States Patent Office 3,248,657
Patented Apr. 26, 1966

3,248,657
PULSE GENERATOR EMPLOYING SERIALLY CONNECTED DELAY LINES

Anatole Turecki, North Palm Beach, Fla., assignor to Radio Corporation of America, a corporation of Delaware Filed Oct. 18, 1963, Ser. No. 317,286
5 Claims. (Cl. 328—55)

This invention relates to new and improved timing pulse generator circuits.

The circuits of the invention include a normally disabled input coincidence gate and a plurality of delay lines connected to one another to provide successive delays to a signal. The first of the delay lines is connected to receive the output of the coincidence gate and the last such line normally feeds back its output as a priming signal to the input coincidence gate. The generator further includes a plurality of other coincidence circuits, each for producing an output in response to a certain permutation of inputs thereto. In one embodiment of the invention, for example, each coincidence gate is connected across a delay line and each such gate produces an output in response to the concurrent presence of a signal at one terminal of its delay line and the absence of a signal at the other terminal of its delay line. The pulse interval in this embodiment is, in each case, equal to the delay introduced by a delay line.

The invention is discussed in greater detail below and is shown in the following drawings of which:

FIGS. 1*a*–1*d* are drawings of symbols employed in FIGS. 2 and 4;

Similar reference numerals identify similar circuti elements in the various figures.

FIG. 1 is believed to be self-explanatory. Boolean equations next to the NOR and AND gates, respectively, define the logic operations performed by these gates.

Figure 1A:
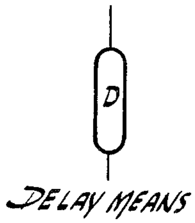
Figure 1B:
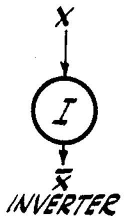
Figure 1C:
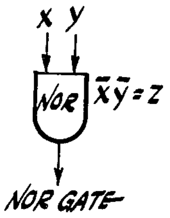
Figure 1D:
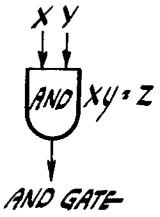
Figure 2:
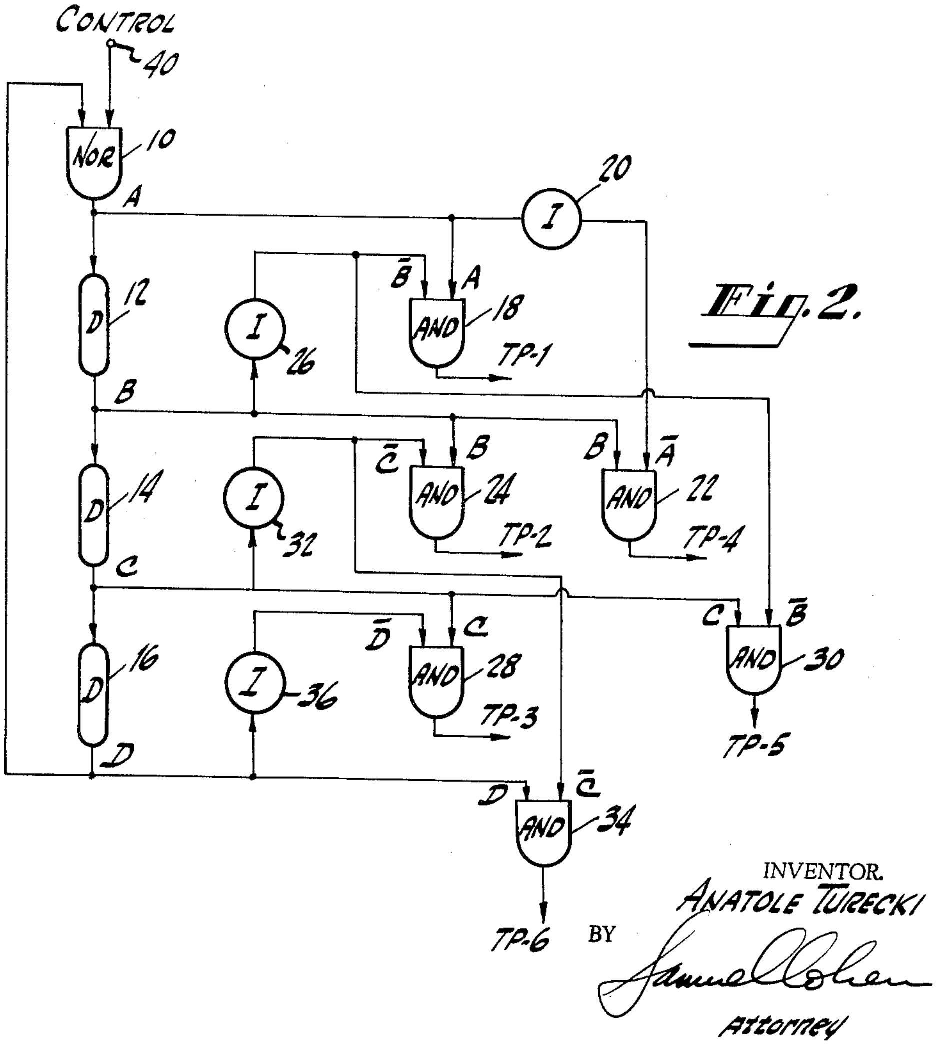
FIG. 2 is a block circuit diagram of one form of the present invention.

The circuit of FIG. 2 includes an input NOR gate 10 followed by three delay means 12, 14 and 16, respectively. Where pulses of equal duration are desired, the delay lines employed are all of the same value, that is, they insert the same time delay. The first delay means 12 is connected to receive the output of the NOR gate 10 and the last delay means 16 feeds back its output as an input to the NOR gate 10. The A output of NOR gate 10 is applied as an input to AND gate 18 and is also applied through an inverter 20 as an input to AND gate 22. The B output of delay means 12 is applied as an input to AND gates 24 and 22 and through an inverter 26 as a second input to AND gate 18. The C output of delay means 14 is applied as an input to AND gates 28 and 30 and through an inverter 32 as a second input to AND gate 24. The D output of delay means 16 is applied as an input to AND gate 34 and through inverter 36 as a second input to AND gate 28. The second input to AND gate 34 is the $\overline{C}$ output of inverter 32.

In the discussion which follows of the operation of the circuit of FIG. 2, for the sake of brevity, the outputs of various circuits are referred to as a one or a zero rather than as a signal manifesting a one or a zero. The signal may be at a relatively high level or at a relatively low level for either binary bit depending upon the convention adopted. However, it is arbitrarily assumed, for the sake of convenience, that a high level signal represents a one and a low level signal represents a zero.

In the operation of the system of FIG. 2, the control signal applied to terminal 40 is normally a one. Therefore, NOR gate 10 is disabled and produces a zero output. Accordingly, A, B, C and D are all zero. The $D=0$ output of delay means 16 serves as a priming signal for NOR gate 10.

When the control signal applied to terminal 40 is changed to zero, NOR gate 10 produces an $A=1$ output. This serves as an enabling signal for AND gate 18, since B is equal to zero and therefore, $\overline{B}$, the output of inverter 26, and the second input to gate 18 is equal to one. Accordingly, AND gate 18 is enabled and produces the first timing pulse TP–1. The various waveforms involved are shown in FIG. 2.

After the delay inserted by delay means 12, B changes to a one ($\overline{B}$ changes to zero) thereby disabling AND gate 18 and terminating TP–1. At this time $C=0$ and $\overline{C}=1$. Accordingly, when B changes to one, AND gate 24 is enabled and TP–2 starts.

In a manner similar to the above, after the additional delay inserted by delay means 114, C changes to 1, disabling AND gate 24. This terminates TP–2. AND gate 28, which receives the inputs $\overline{D}$ and C becomes enabled when TP–2 terminates and this starts TP–3. The remainder of the circuit operation should be clear from the explanation given so far and can readily be followed by referring to FIG. 3.

In a practical circuit such as shown in FIG. 2, the delay means such as 12 preferably includes, in each case, a delay line, usually of the artificial type, a driver at the input of the delay line and a receiver at the output of the delay line. The driver is a transistor and the receiver is a transistor. The purpose of these transistors is to improve the wave shape and to provide levels of sufficiently high amplitude to drive the circuits receiving the timing pulses.

In a previous delay line pulse generator, the number of delay means employed had to be equal to the number of pulses. In this previous arrangement, an input pulse is applied to a plurality of series connected delay means and an output pulse is taken at the output of each delay means. An important advantage of the present arrangement is that only half the number of delay means are required to produce the same number of output pulses as the previous circuit. In the circuit illustrated in FIG. 2, for example, three delay means produce six timing pulses—a saving of three delay means over the previous circuit. The cost is the additional AND gates and inverters shown, but the three delay means saved include a saving of three drivers and three receivers (i.e. six transistors). Overall, the present arrangement, in practice, is found to be less expensive than the previous one.

In addition to the above, the artificial delay lines are relatively large—several inches long. The transistors, on the other hand, are quite small and, in total, the circuit of FIG. 2 is much more compact than the previous arrangement. This is important in the manufacture of a data processing machine as it permits more circuits to be placed on a standard "plug in" board (an insulator board on which standard circuits which make up the machine are mounted).

An additional advantage of the present circuit is that once a direct current level is applied, timing pulses are continuously generated. In the previous circuit a rather complicated "start logic" circuit is necessary since the input to the circuit includes a free running oscillator which must be synchronized with the start pulse. Further, the circuit of the present invention provides consecutive pulses which are adjacent to one another. In the previous circuit overlaps or gaps occur unless the frequency of the input pulse generator is adjusted exactly to the actual delays introduced by the delay lines. Also, as is discussed shortly, in the present circuit timing pulses of double or greater the duration of a single timing pulse can easily be produced.

Figure 4:
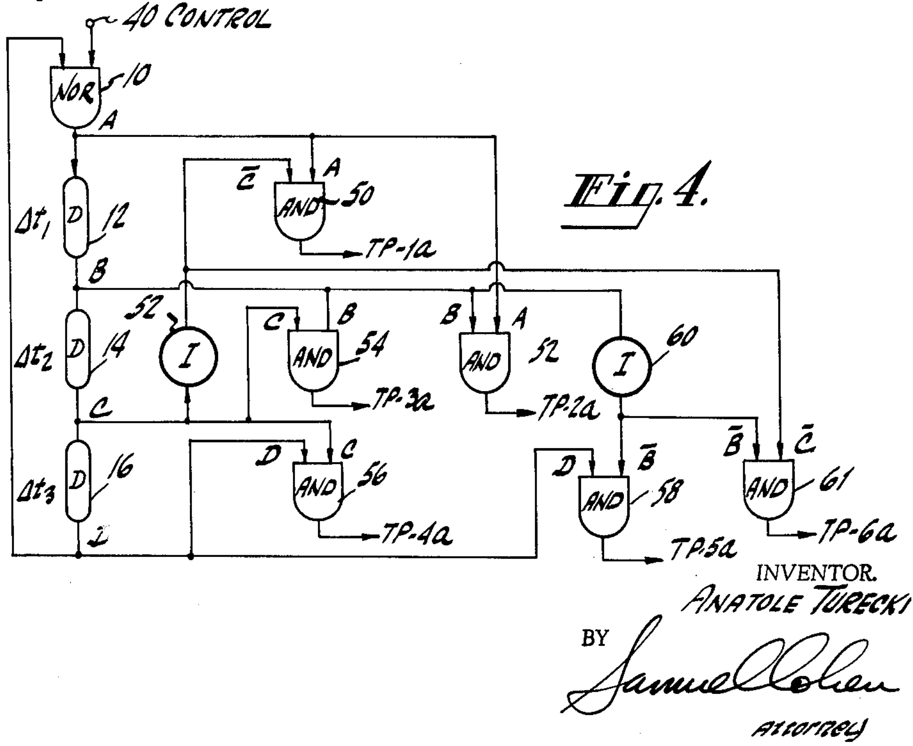
FIGS. 4 and 5 are block circuit diagrams of other forms of the invention.

The circuit of FIG. 4 produces output pulses of double the duration of the pulses produced by the circuit of FIG. 2 with delay lines of the same value as in the circuit of FIG. 2. Also, the pulses occur in overlapping time sequence rather than with the leading edge of one pulse concurrent with the lagging edge of the preceding pulse, as in the embodiment of FIG. 2. In the circuit of FIG. 4 AND gate 50 receives inputs A and $\overline{C}$. $\overline{C}$ is produced by inverter 52. AND gates 52, 54 and 56 receive inputs AB, BC and CD, respectively. AND gate 58 receives inputs $\overline{B}$ and D. The input $\overline{B}$ is provided by inverter 60. AND gate 61 receives inputs $\overline{B}$ $\overline{C}$.

Figure 3:
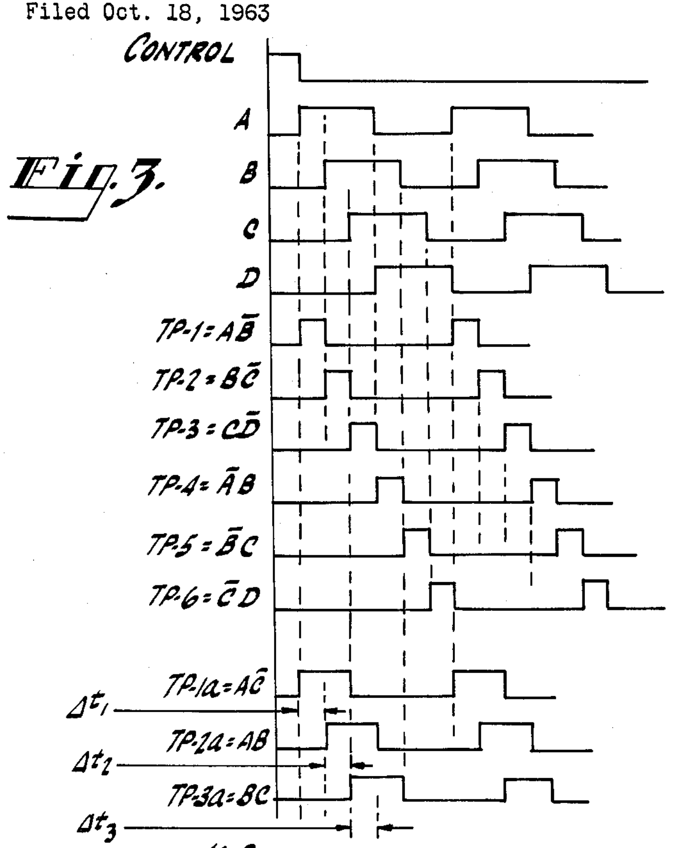
FIG. 3 is a drawing of waveforms to explain the operation of the circuit of FIGS. 2 and 4.

The operation of the circuit of FIG. 4 is shown in part in the last three waveforms of FIG. 3. As in the previous circuit, when the control signal applied to terminal 40 is changed to a zero, A becomes one. This enables AND gate 50, which is concurrently primed with the $\overline{C}=1$ signal. After the delay interval inserted by delay means 12 and 14, C changes to a one ($\overline{C}$ becomes zero) and control pulse TP–1$a$ terminates. Control pulse TP–2$a$ starts when both B and A are one. The start of this pulse therefore starts an interval equal to the delay $\Delta t_1$ introduced by delay means 12, after the pulse TP–1 starts. The pulse TP–2$a$ terminates when A changes from one back to zero. This occurs an interval equal to the total delay $\Delta t_1+\Delta t_2+\Delta t_3$ inserted by delay means 12, 14 and 16, after the start of pulse TP–1$a$. At that time, D changes from zero to one and this causes A to change from one to zero.

Summarizing the operation so far, TP–1$a$ starts when A changes to one. Control pulse TP–2$a$ starts when B changes to one. This occurs an interval $\Delta t_1$ after the start of TP–1$a$. Pulse TP–1$a$ terminates after an interval $\Delta t_2$ plus $\Delta t_1$, the total delay inserted by delay means 12 and 14. The pulse TP–2 terminates an interval $\Delta t_2$ plus $\Delta t_2$ after it starts. Put another way, pulse TP–2$a$ terminates an interval $\Delta t_3$ after the pulse TP–1$a$ terminates.

The pulse TP–3$a$ starts concurrently with the termination of the pulse TP–1$a$, that is, when C changes to one. The pulse TP–3$a$ terminates when B changes from one to zero. This is an interval $\Delta t_1$ after the termination of pulse TP–2$a$. The remainder of the operation of the circuit of FIG. 4 should be clear from the figure.

In the circuits of FIGS. 2 and 4, the input coincidence gate is a NOR gate and the other coincidence gates are AND gates. It should be appreciated that with minor circuit change other types of gates may be used instead. For example, an AND gate may be substituted for the NOR gate 10, provided an inverter is placed in series with the feedback lead from delay line 16 and a high level signal (a one) is employed to enable the gate. NOR gates may be substituted for the AND gates such as 18, 22 and the like provided the signals A–D and their complements are applied to the gates in appropriate combinations. For example, the NOR gate receiving $\overline{A}$ B would produce TP–1; the NOR gate receiving $\overline{B}$ C would produce TP–2; the NOR gate receiving $\overline{C}$ D would produce TP–3; the NOR gate receiving A $\overline{B}$ would produce TP–4 and so on.

Figure 5:
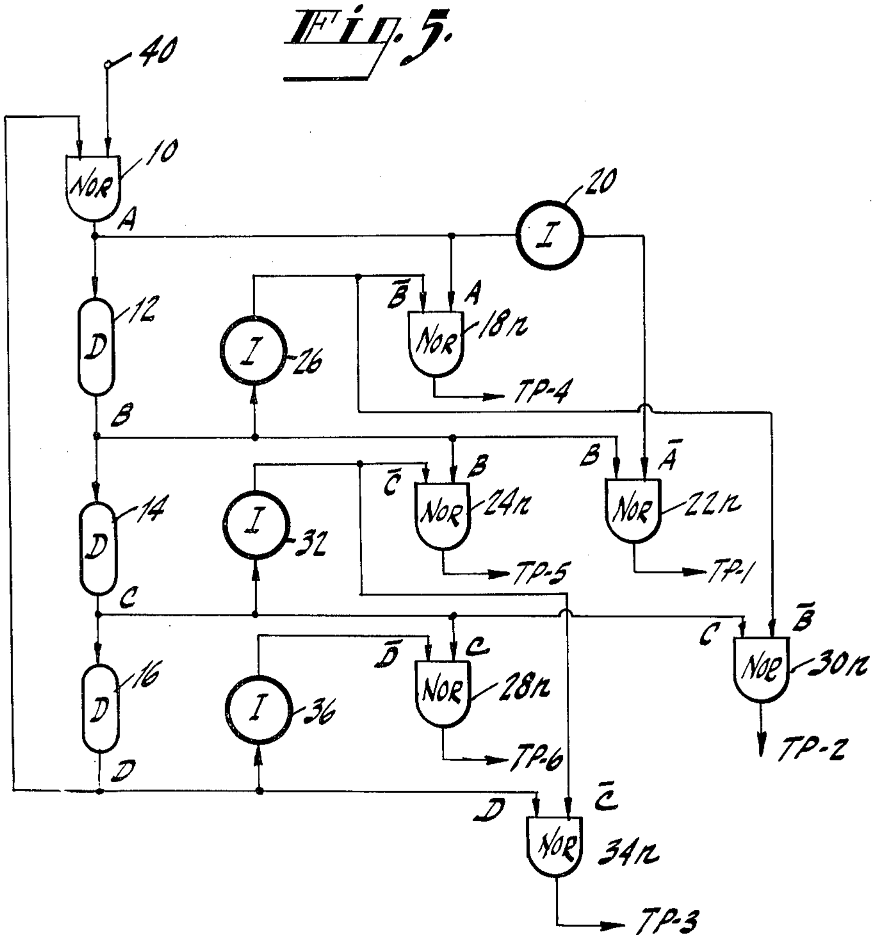

FIGURE 5 illustrates a modified form of pulse generator circuit in which all of the gates employed are NOR gates. As a matter of fact, even the inverters, in practice, are NOR gates (single input NOR gates). It is advantageous to be able to use all gates of the same type as it makes for more uniformity in the manufacturing process and, also, it permits savings to be made in view of the larger number of the same type of circuit elements employed.

The circuit of FIGURE 5 is identical to the circuit of FIGURE 2 except for the substitution of the NOR gates for the AND gates. However, whereas previously AND gate 22 produces the fourth timing pulse TP–4, the corresponding NOR gate 22$n$ produces the first timing pulse TP–1. In addition, NOR gate 30$n$ produces timing pulse TP–2, NOR gate 34$n$ produces timing pulse TP–3, NOR gate 18$n$ produces timing pulse TP–4, NOR gate 24$n$ produces timing pulse TP–5, and NOR gate 28$n$ produces timing pulse TP–6.

What is claimed is:

1. A pulse generator comprising, in combination:

a normally disabled input coincidence gate;

a plurality of delay means connected one to another to provide successive delays to a signal, the first such delay means being connected to receive the output of the coincidence gate and the last such delay means normally supplying its output as a priming signal to the coincidence gate;

a plurality of two input logic circuits, each connected at its two inputs across at least one delay means, and at least some of said logic circuits producing an output solely in response to the concurrence at its two inputs of the presence of one signal and the absence of another signal, respectively; and means coupled to said input coincidence gate, for applying an enabling second input thereto.

2. In the generator set forth in claim 1, at least some of said logic circuits each comprising a two input coincidence gate for producing an output in response to signals representing the same binary digit, and an inverter in series solely with one input to said gate.

3. A pulse generator comprising, in combination:

a normally disabled two input NOR gate;

a plurality of delay lines connected one to another to provide successive delays to a signal, with the first such line connected to receive the output of the NOR gate and the last such line normally supplying its output as a priming signal to the NOR gate;

a plurality of two input AND gates, each gate connected at one input directly to one end of a delay line, and at its other input through an inverter to the other end of the same delay line; and means coupled to said NOR gate, for applying an enabling signal to the second input thereto.

4. A pulse generator comprising, in combination:

a normally disabled two input coincidence gate which produces an output in response to input signals indicative of a binary bit of one value;

a plurality of delay lines connected one to another to provide successive delays to a signal, with the first such line connected to receive the output of the coincidence gate and the last such line normally supplying its output as a priming signal to the coincidence gate;

a plurality of normally disabled, two input coincidence gates each for producing an output in response to input signals indicative of a binary bit of the other value, each said last-named coincidence gate being connected at one input to one end of a delay line, and at its other input through an inverter to the other end of the same delay line; and means coupled to said input coincidence gate, for applying an enabling second input thereto.

5. A pulse generator comprising, in combination:

a normally disabled input coincidence gate;

a plurality of delay lines connected one to another to provide successive delays to a signal, with the first such line connected to receive the output of the coincidence gate and the last such line normally supplying its output as a priming signal to the coincidence gate;

a plurality of two input logic circuits, each connected at its two inputs across a delay line, and each producing an output in response to the concurrent presence of a signal at one of its inputs and the absence of a signal at the other of its inputs; and means coupled to said input coincidence gate, for applying an enabling second input thereto.

References Cited by the Examiner

UNITED STATES PATENTS

| | | | |
|---|---|---|---|
| 3,054,072 | 9/1962 | Beaulieu et al. | 307—88.5 |
| 3,157,838 | 11/1964 | Glaser | 307—88.5 X |

ARTHUR GAUSS, *Primary Examiner.*

DAVID J. GALVIN, *Examiner.*

S. D. MILLER, J. HEYMAN, *Assistant Examiners.*